United States Patent
Lagrasta et al.

(10) Patent No.: US 10,128,295 B2
(45) Date of Patent: Nov. 13, 2018

(54) METAL SHIELD TRENCHES AND METAL SUBSTRATE CONTACTS SUPPORTED WITHIN THE PREMETALLIZATION DIELECTRIC (PMD) LAYER OF AN INTEGRATED CIRCUIT USING A MIDDLE END OF LINE (MEOL) PROCESS

(71) Applicant: STMicroelectronics (Crolles 2) SAS, Crolles (FR)

(72) Inventors: Sebastien Lagrasta, La Terrasse (FR); Delia Ristoiu, Saint Ismier (FR); Jean-Pierre Oddou, Saint Ismier (FR); Cécile Jenny, Challes les Eaux (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 15/866,995

(22) Filed: Jan. 10, 2018

(65) Prior Publication Data

US 2018/0158861 A1    Jun. 7, 2018

Related U.S. Application Data

(62) Division of application No. 15/263,922, filed on Sep. 13, 2016, now Pat. No. 9,917,126.

(51) Int. Cl.
*H01L 27/146* (2006.01)

(52) U.S. Cl.
CPC .... *H01L 27/14636* (2013.01); *H01L 27/1463* (2013.01); *H01L 27/14623* (2013.01); *H01L 27/14654* (2013.01); *H01L 27/14685* (2013.01); *H01L 27/14689* (2013.01); *H01L 27/14641* (2013.01)

(58) Field of Classification Search
CPC .......... H01L 27/14636; H01L 27/1463; H01L 27/14623; H01L 27/14685; H01L 27/14689; H01L 27/14654; H01L 27/14641

See application file for complete search history.

(56) References Cited

U.S. PATENT DOCUMENTS

| | | | |
|---|---|---|---|
| 9,236,407 B2 | 1/2016 | Roy et al. | |
| 9,543,320 B2* | 1/2017 | Pang | H01L 27/11556 |
| 9,547,125 B2* | 1/2017 | Assefa | H01L 31/02327 |
| 9,583,527 B1* | 2/2017 | Leung | H01L 27/14636 |

(Continued)

*Primary Examiner* — Victor A Mandala
(74) *Attorney, Agent, or Firm* — Crowe & Dunlevy

(57) ABSTRACT

A semiconductor substrate includes a photodiode region, a charge storage region electrically coupled to the photodiode region and a capacitive deep trench isolation (CDTI) structure including a conductive region positioned between the photodiode region and the charge storage region. A contact etch stop layer overlies the semiconductor substrate and a premetallization dielectric layer overlies the contact etch stop layer. A first trench, filled with a metal material, extends through the premetallization dielectric layer and bottoms out at or in the contact etch stop layer. A second trench, also filled with the metal material, extends through the premetallization dielectric layer and the contact etch stop layer and bottoms out at or in the conductive region of the CDTI structure. The metal filled first trench forms an optical shield between the photodiode region and the charge storage region. The metal filled second trench forms a contact for biasing the CDTI structure.

25 Claims, 14 Drawing Sheets

(56) References Cited

U.S. PATENT DOCUMENTS

2016/0150169 A1\* 5/2016 Hynecek ............... H04N 5/374
       348/308
2017/0062495 A1\* 3/2017 Huang ............... H01L 27/1463

\* cited by examiner

ID CIRCUIT USING A MIDDLE
METAL SHIELD TRENCHES AND METAL SUBSTRATE CONTACTS SUPPORTED WITHIN THE PREMETALLIZATION DIELECTRIC (PMD) LAYER OF AN INTEGRATED CIRCUIT USING A MIDDLE END OF LINE (MEOL) PROCESS

CROSS-REFERENCE TO RELATED APPLICATION

This application is a divisional of U.S. patent application Ser. No. 15/263,922 filed Sep. 13, 2016, the disclosure of which is incorporated by reference.

TECHNICAL FIELD

The present invention relates to the provision of metal shield trenches and metal substrate contacts within the premetallization dielectric layer of an integrated circuit. In a specific implementation for a front-side illuminated light sensor, the metal shield trenches provide an optical shield to prevent light intrusion onto sensitive circuitry.

BACKGROUND

Front-side illuminated light sensors are well known in the art. The photosensitive region on the front side of the light sensor generates charges when exposed to light. Those charges are accumulated during an integration phase within the photosensitive region and transferred to a memory area. During a next integration phase, the previously transferred charges are read out from the memory area using a read circuit.

It is important for the light sensor to include some optical shielding. For example, optical shielding may be provided between adjacent light sensors in an imaging array in order to ensure that the light directed toward one photosensitive region does not impinge on an adjacent photosensitive region. Additionally, optical shielding may be provided within the light sensor over the memory area in order to ensure that light directed toward the photosensitive region does not additionally generate charges in the memory area.

A premetallization dielectric (PMD) layer is typically provided at the front side of the light sensor. Metal substrate contacts pass through the PMD layer to electrically connect the integrated circuitry in and on the substrate to the metal lines supported within overlying metallization layers. There is a need in the art to support both metal shield trenches and metal substrate contacts within the PMD layer.

SUMMARY

In an embodiment, an integrated circuit comprises: a semiconductor substrate including a doped source or drain region for a transistor; a contact etch stop layer overlying the semiconductor substrate; a premetallization dielectric layer overlying the contact etch stop layer; a first trench filled with a metal material, said first trench extending through the premetallization dielectric layer and having a bottom terminating at or in, without passing through, the contact etch stop layer; and a second trench filled with a metal material that is the same metal material filling the first trench, said second trench extending through the premetallization dielectric layer and the contact etch stop layer and having a bottom terminating at or in, without passing through, the doped source or drain region.

In an embodiment, a method comprises: forming a conductive region supported by a semiconductor substrate; depositing a contact etch stop layer overlying the semiconductor substrate and covering the conductive region; depositing a premetallization dielectric layer overlying the contact etch stop layer; forming a first trench in the premetallization dielectric layer, said first trench extending through the premetallization dielectric layer and having a bottom terminating at or in, without passing through, the contact etch stop layer; filling said first trench with a non-conductive material; forming a second trench in the premetallization dielectric layer, said second trench extending through the premetallization dielectric layer and the contact etch stop layer and having a bottom terminating at or in, without passing through, the conductive region; removing the non-conductive material from the first trench; and filling the first and second trenches with a same metal material.

In an embodiment, a method comprises: forming a doped source or drain region for a transistor in a semiconductor substrate; depositing a contact etch stop layer overlying the semiconductor substrate; depositing a premetallization dielectric layer overlying the contact etch stop layer; forming a first trench in the premetallization dielectric layer, said first trench extending through the premetallization dielectric layer and having a bottom terminating at or in, without passing through, the contact etch stop layer; filling said first trench with a non-conductive material; forming a second trench in the premetallization dielectric layer, said second trench extending through the premetallization dielectric layer and the contact etch stop layer and having a bottom terminating at or in, without passing through, the doped source or drain region; removing the non-conductive material from the first trench; and filling the first and second trenches with a same metal material.

In an embodiment, a method comprises: forming a transistor having a gate over a semiconductor substrate; depositing a contact etch stop layer overlying the semiconductor substrate; depositing a premetallization dielectric layer overlying the contact etch stop layer; forming a first trench in the premetallization dielectric layer, said first trench extending through the premetallization dielectric layer and having a bottom terminating at or in, without passing through, the contact etch stop layer; filling said first trench with a non-conductive material; forming a second trench in the premetallization dielectric layer, said second trench extending through the premetallization dielectric layer and the contact etch stop layer and having a bottom terminating at or in, without passing through, the gate of transistor; removing the non-conductive material from the first trench; and filling the first and second trenches with a same metal material.

In an embodiment, a method comprises: forming a capacitive deep trench isolation structure in a semiconductor substrate, the capacitive deep trench isolation structure including a conductive region; depositing a contact etch stop layer overlying the semiconductor substrate; depositing a premetallization dielectric layer overlying the contact etch stop layer; forming a first trench in the premetallization dielectric layer, said first trench extending through the premetallization dielectric layer and having a bottom terminating at or in, without passing through, the contact etch stop layer; filling said first trench with a non-conductive material; forming a second trench in the premetallization dielectric layer, said second trench extending through the premetallization dielectric layer and the contact etch stop layer and having a bottom terminating at or in, without passing through, the conductive region of the capacitive deep trench isolation structure; removing the non-conductive material from the first trench; and filling the first and second trenches with a same metal material.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
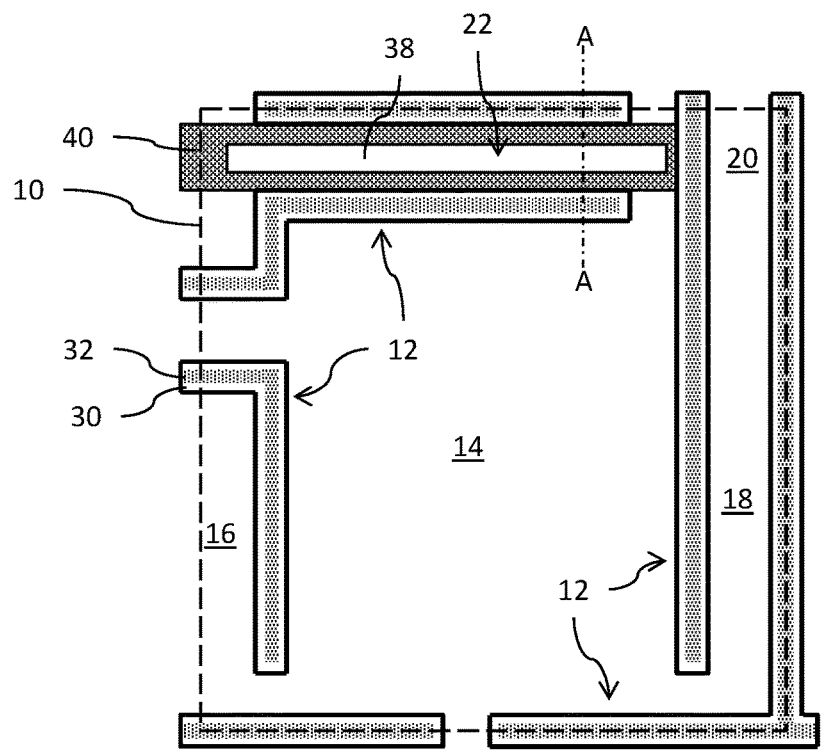
FIG. 1 is a plan layout for a pixel.

Reference is now made to FIG. 1 showing a plan layout of a pixel 10 of an image sensor array that includes many such pixels 10 arranged in an array format defined by a plurality of rows and columns. The pixel 10 includes a plurality of capacitive deep trench isolation (CDTI) structures 12 which generally delimit circuit regions of the pixel. For example, the CDTI structures 12 delimit a photosensitive region 14, an anti-blooming region 16, a memory region 18, a sensing node region 20 and a signal treatment region 22. An active region 38 comprising, for example, a doped well within the signal treatment region 22, may be delimited by a shallow trench isolation (STI) structure 40. The pixel layout may be tiled in a manner well known to those skilled in the art to form the sensor array. In such an array, certain structures such as, for example, the anti-blooming region 16, the sensing node region 20 and the signal treatment region 22, may be shared circuitry between two or more adjacent pixels in the array.

Figure 2:
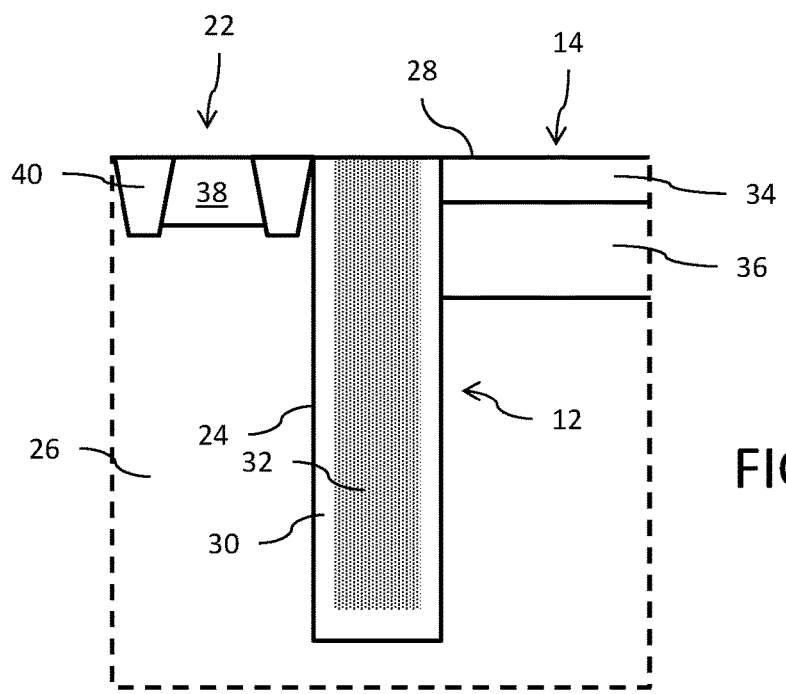
FIG. 2 is a cross-section of a capacitive deep trench isolation (CDTI) structure within the pixel.

FIG. 2 shows a cross section taken along line A-A of FIG. 1 through the signal treatment region 22, one CDTI structure 12 and a portion of the photosensitive region 14. A trench 24 is formed extending into a semiconductor substrate 26 from a top surface 28. The trench 24 is lined with an insulating material 30 such as an oxide material and filled with a conductive material 32 such as a metal or polysilicon. The substrate 26 may, for example, be lightly doped with a first conductivity type dopant and include one or more doped regions 34, 36 and 38 that are doped of the same or different conductivity type dopants as needed for the circuit application. As an example, the photosensitive region 14 may include region 34 that is heavily doped with the first conductivity type dopant and region 36 that is doped with a second conductivity type dopant to form a vertically pinned photodiode.

In operation, light is received at the photosensitive region 14 and charges are generated. Those charges are accumulated during an integration phase within the photosensitive region 14 (for example, in the doped region 36). After the integration period terminates, the accumulated charges are transferred from the photosensitive region 14 to the memory region 18. During a next exposure integration phase, the transferred charges in the memory region 18 are read out using read circuitry associated with the sensing node region 20 and the signal treatment region 22.

The plan view of FIG. 1 is at the level of the top surface 28 of the substrate 26.

Figure 3:
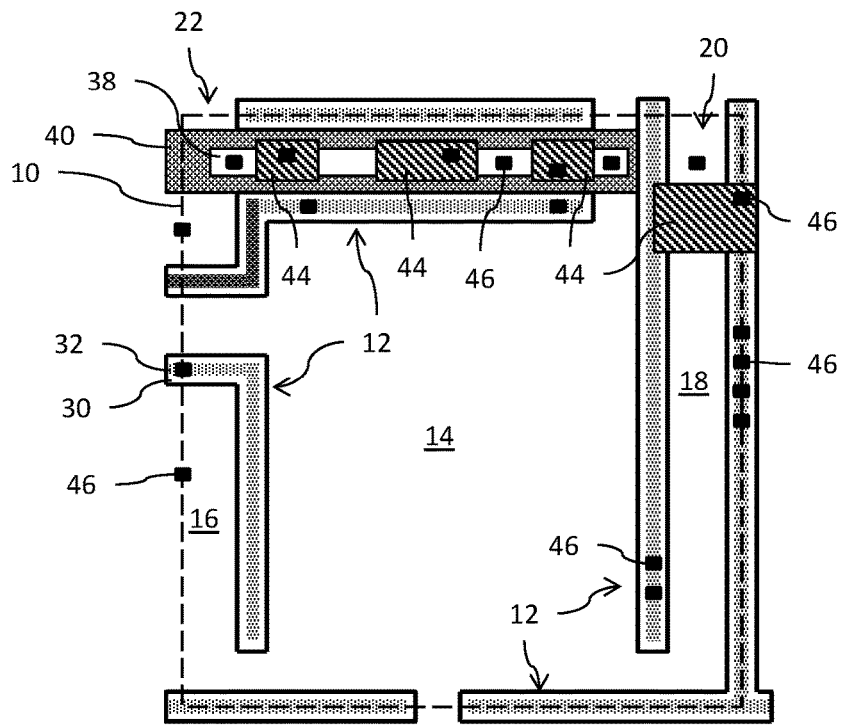
FIG. 3 is a further plan layout for the pixel showing additional structures.

FIG. 3 is a plan view which adds the transistor gate structures 44 and metal contacts 46 above the level of the top surface 28 of the substrate 26 that make electrical contact to the CDTI structures 12, the gate structures 44 and to the substrate 26 (for example, at source and drain regions of transistors). The metal contacts 46 may, for example, be formed of a tungsten material.

Figure 4A:
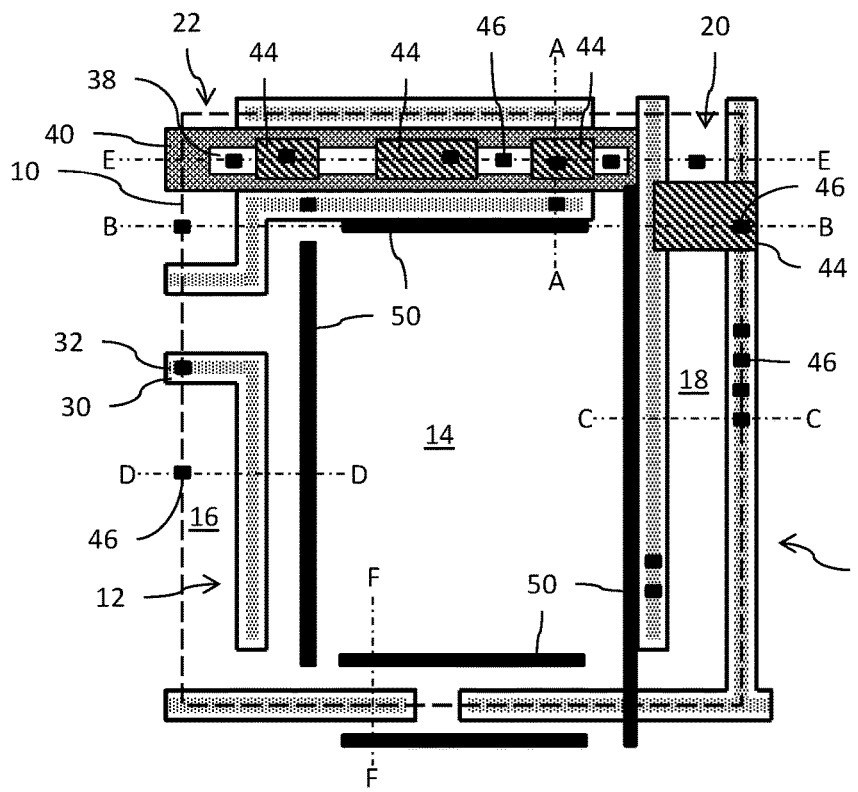
FIG. 4A is a further plan layout for the pixel showing additional structures.

FIG. 4A is a plan view which further adds metal shield trenches 50. The metal shield trenches 50 are provided to substantially surround the photosensitive region 14 and in particular to provide an optical barrier between the photosensitive region 14 and each of the anti-blooming region 16, the memory region 18 and the signal treatment region 22. The metal shield trenches 50 may, for example, be formed of a tungsten material.

The plan views of FIGS. 3 and 4A are at the level of the top surface 68 of a premetallization dielectric (PMD) layer 66 (see, FIGS. 5A-5F). The metal contacts 46 extend through the PMD layer 66 and contact etch stop layer 60 from the top surface 68 of the PMD layer 66 to reach and make electrical contact with the CDTI structures 12, the gate structures 44 and to the substrate 26. The metal shield trenches 50 also extend through the PMD layer 66 from the top surface 68 of the PMD layer 66 to reach, but not pass through, the contact etch stop layer 60. The process for forming the metal contacts 46 and metal shield trenches 50 within trench openings in the PMD layer 66 is described in detail herein.

Figure 4B:
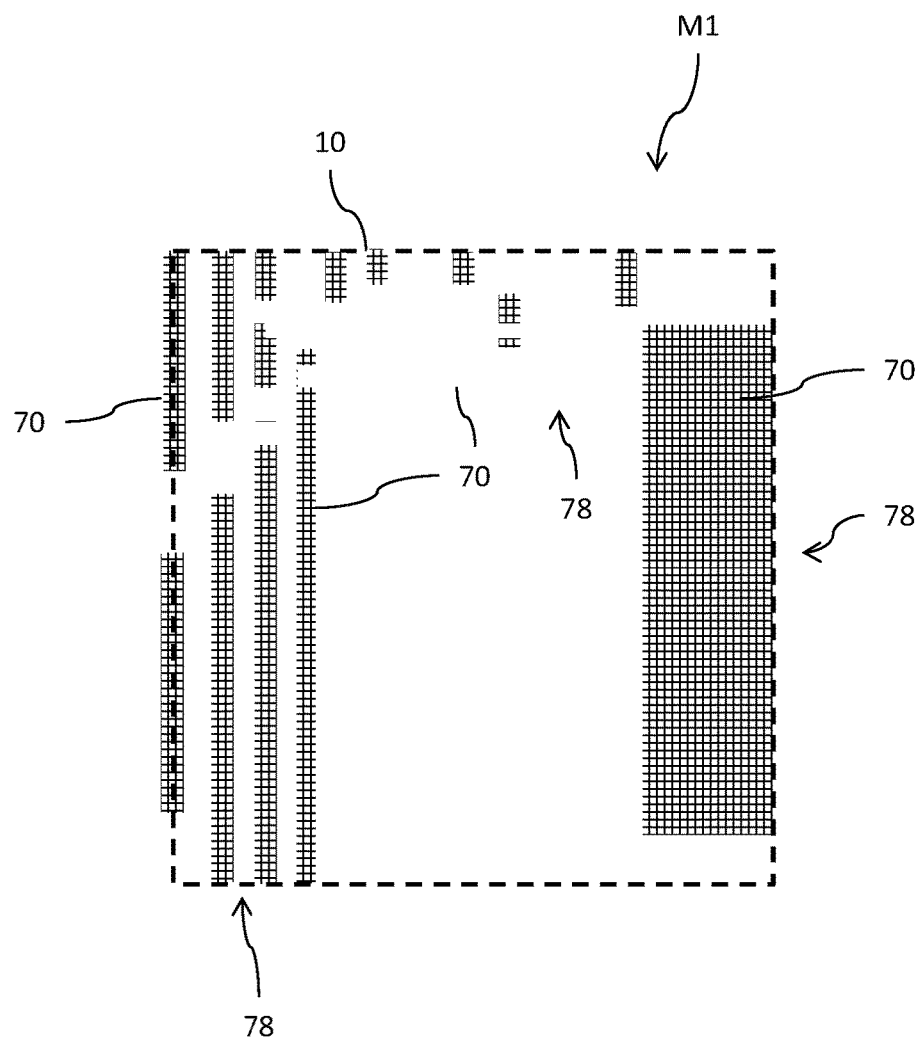
FIG. 4B is a further plan layout for a first metallization level.

FIG. 4B is a plan view which shows a first metallization level M1 over the PMD layer 66. The first metallization level M1 includes metal lines 70 which form routing lines as well as an optical shield 78. The routing at the first metallization level M1 for signal lines shown in FIG. 4B is by example only.

Figure 5A:
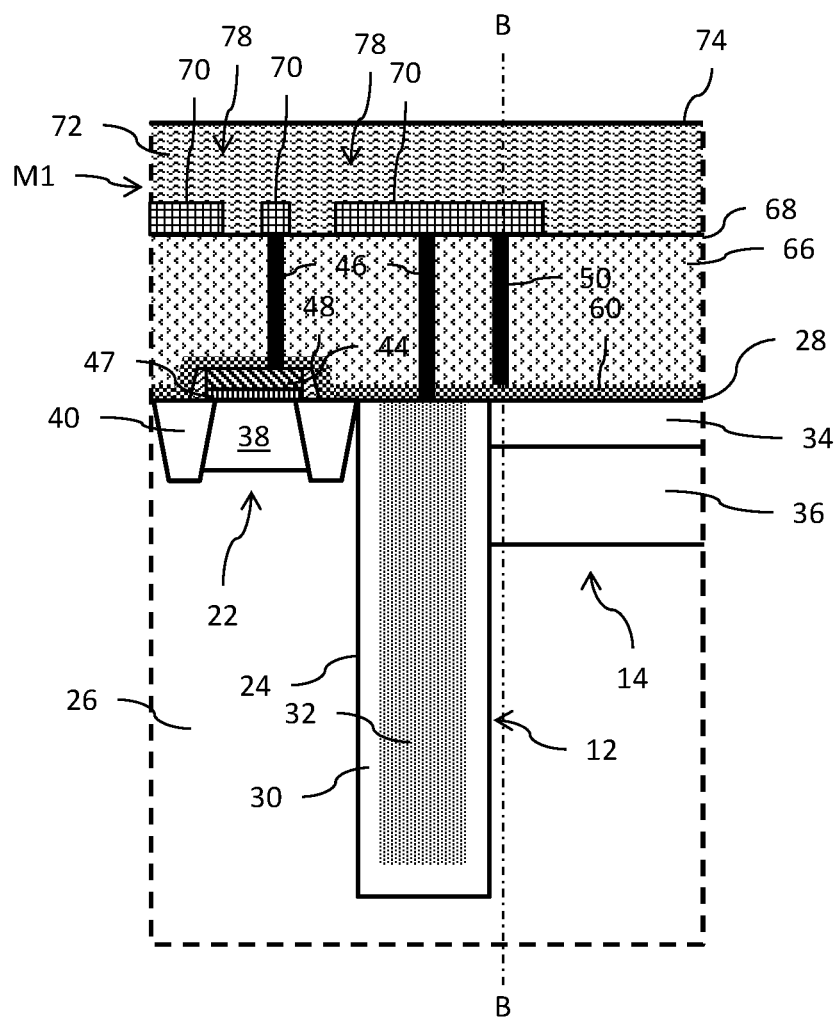
FIGS. 5A-5F are cross-sectional views taken through designated portions of FIG. 4A.
Figure 5B:
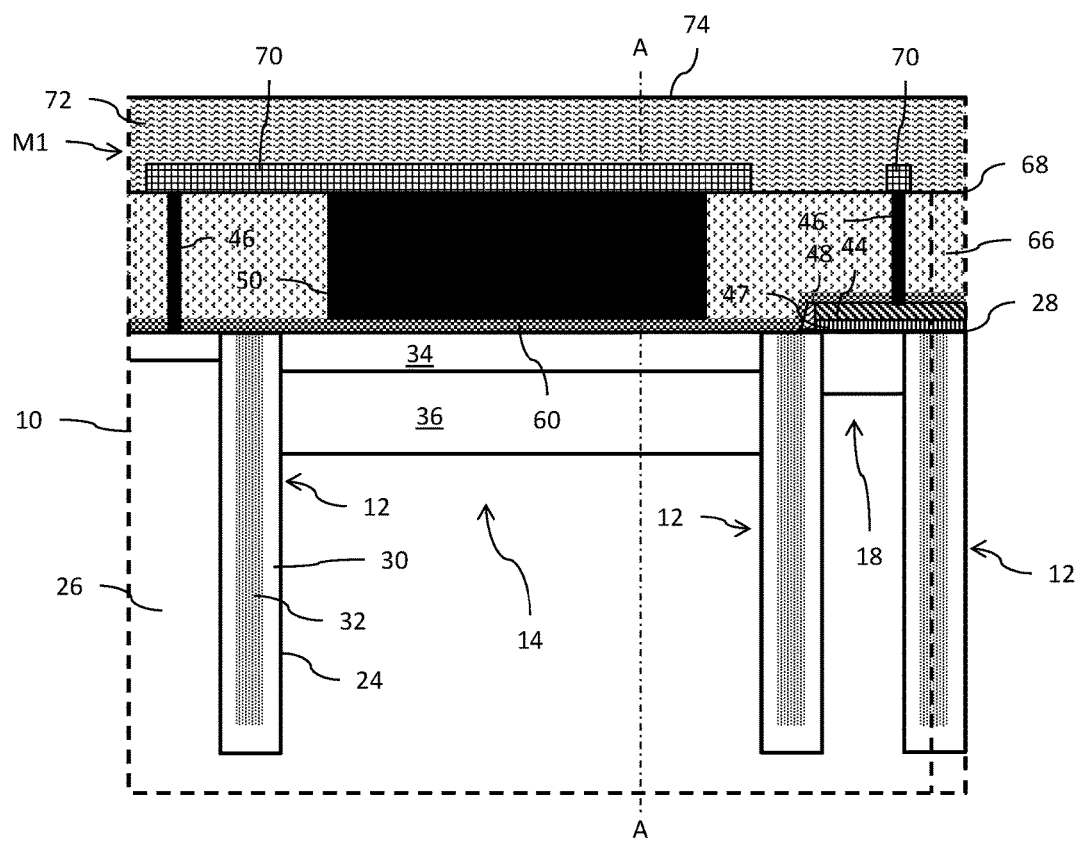

FIG. 5A shows a cross-section taken along line A-A of FIG. 4A through the signal treatment region 22 and into a portion of the photosensitive region 14. FIG. 5B shows a cross-section taken along line B-B of FIG. 4A through the photosensitive region 14 and the memory region 16. A gate dielectric 47 is provided between each gate structure 44 (for example, a polysilicon or metal gate electrode) and the top surface 28 of the active region 36 in the substrate 26. Sidewall spacers 48 are provided on side walls of the gate structure 44. A contact etch stop layer (CESL) 60 is positioned above the top surface 28 of the substrate 26 and over the gate structure 44 and sidewall spacers 48. The PMD layer 66 is positioned above the contact etch stop layer 60. The PMD layer 66 has a planarized top surface 68. The first metallization level M1 is positioned on top of the PMD layer 66. The first metallization level M1 includes a plurality of metal lines 70 within an insulating layer 72. The insulating layer has a planarized top surface 74. At least one of the metal lines 70 is in physical contact with a metal contact 46 and a metal shield trench 50. This metal line 70 forms an optical shield layer 78 over the signal treatment region 22 and may further be used as a bias line for carrying a signal to/from the metal contact 46 or for applying a bias voltage to the metal contact 46. Another metal line 70 is in physical contact with a metal contact 46 coupled to the gate structure 24 of a MOS transistor in the signal treatment region 22. This metal line 70 may be used as a gate control line.

Figure 5C:
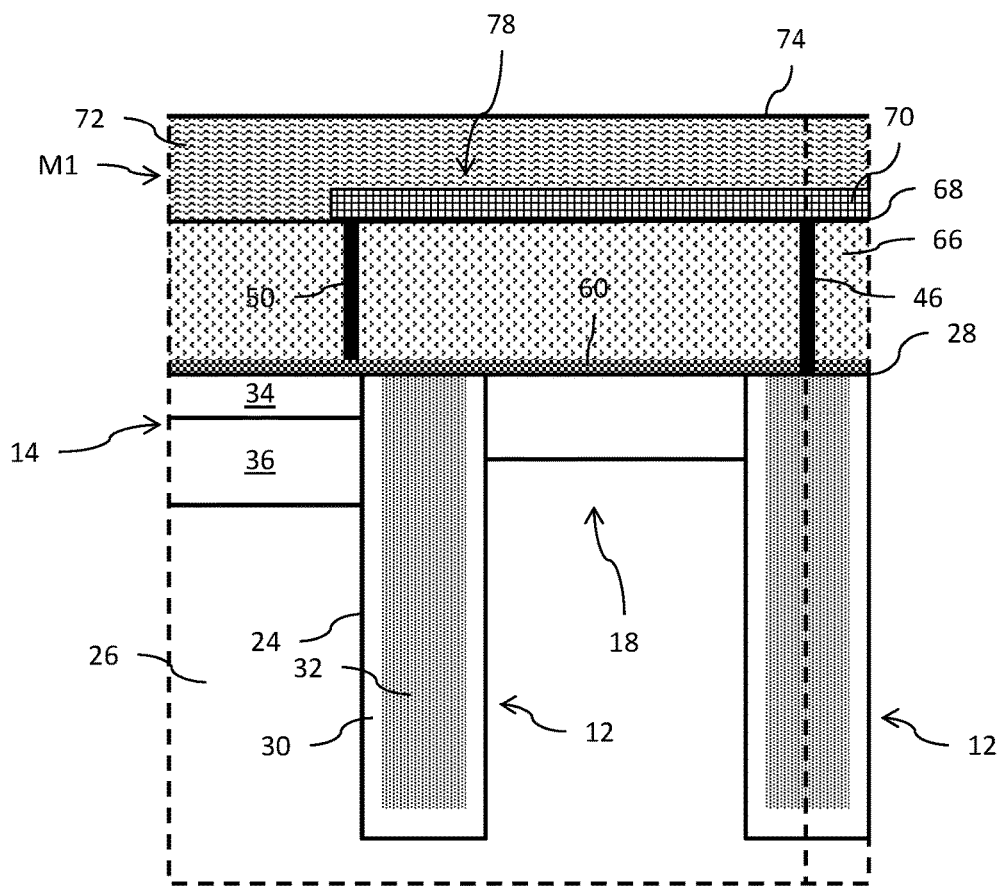

FIG. 5C shows a cross-section taken along line C-C of FIG. 4A through the memory region 18 and a portion of the photosensitive region 14. The contact etch stop layer 60 is positioned above the top surface 28 of the substrate 26. The PMD layer 66 is positioned above the contact etch stop layer 60. The PMD layer 66 has a planarized top surface 68. The first metallization level M1 is positioned on top of the PMD layer 66. The first metallization level M1 includes a plurality of metal lines 70 within an insulating layer 72. The insulating layer has a planarized top surface 74. At least one of the metal lines 70 is in physical contact with the metal contact 46 and the metal shield trench 50. This metal line 70 forms an optical shield layer 78 over the memory region 18. The metal line 70 may also be used as a signal line or bias line for carrying a signal to/from the metal contact 46 or for applying a bias voltage to the metal contact 46.

Figure 5D:
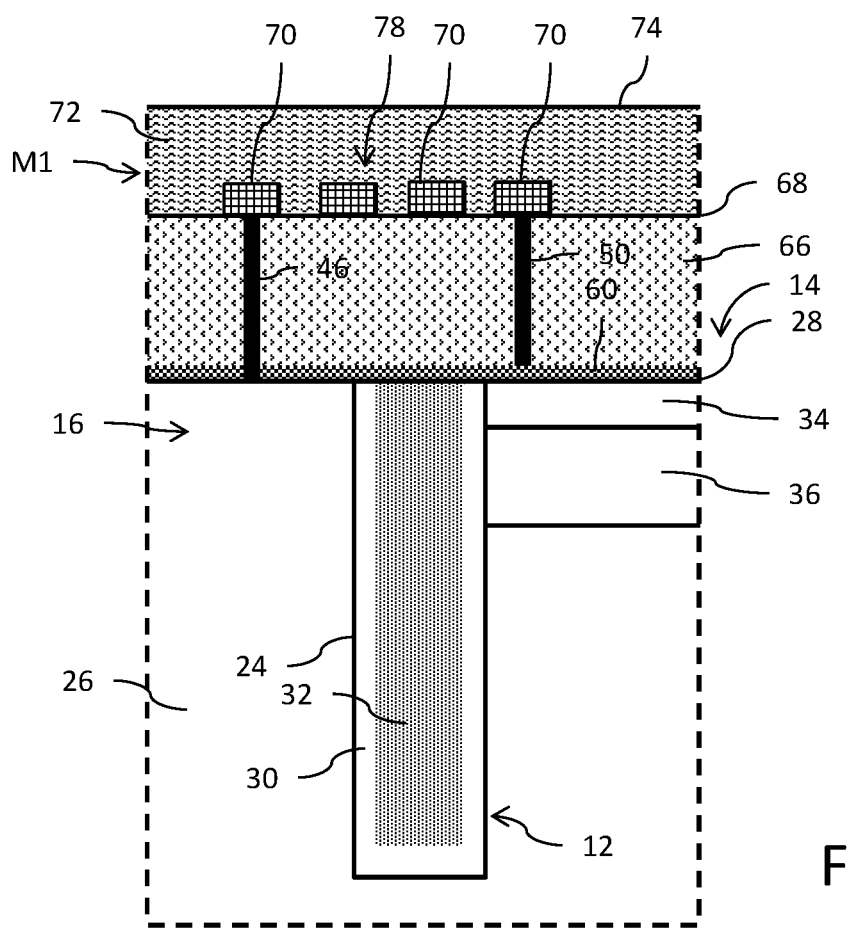

FIG. 5D shows a cross-section taken along line D-D of FIG. 4A through the anti-blooming region 16 and a portion of the photosensitive region 14. The contact etch stop layer 60 is positioned above the top surface 28 of the substrate 26. The PMD layer 66 is positioned above the contact etch stop layer 60. The PMD layer 66 has a planarized top surface 68. The first metallization level M1 is positioned on top of the PMD layer 66. The first metallization level M1 includes metal lines 70 within the insulating layer 72. The insulating layer has a planarized top surface 74. At least one metal line 70 is in physical contact with the metal contact 46 and at least one other metal line 70 is in physical contact with the metal shield trench 50. The metal lines 70 together form an optical shield layer 78 over the anti-blooming region 16. The metal lines 70 may also be used as a signal line or bias line for carrying a signal to/from the metal contact 46 or for applying a bias voltage to the metal contact 46.

Figure 5E:
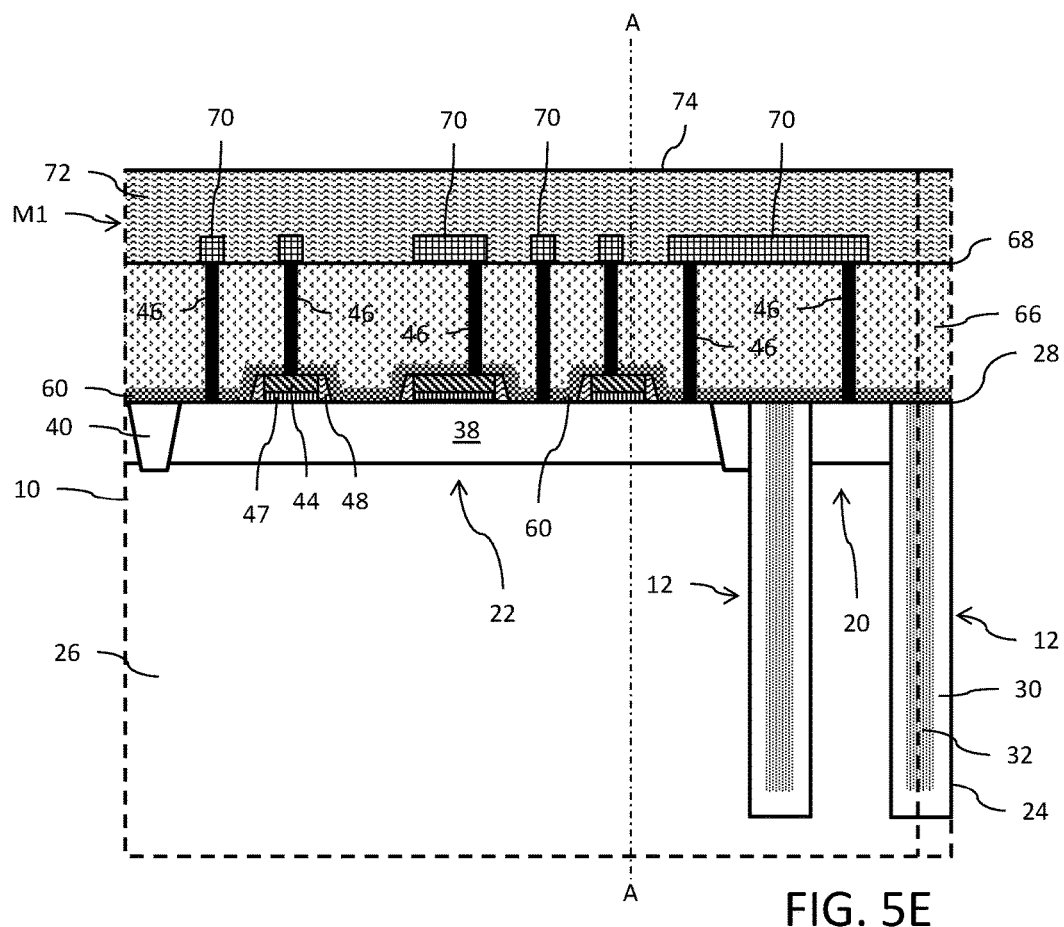

FIG. 5E shows a cross-section taken along line E-E of FIG. 4A through the sensing node region 20 and signal treatment region 22. The contact etch stop layer 60 is positioned above the top surface 28 of the substrate 26. The PMD layer 66 is positioned above the contact etch stop layer 60. The PMD layer 66 has a planarized top surface 68. The first metallization level M1 is positioned on top of the PMD layer 66. The first metallization level M1 includes metal lines 70 within the insulating layer 72. The insulating layer has a planarized top surface 74. The metal lines are provided for making electrical contact to and performing signal routing between the metal contact 46 that are in electrical contact with gate, source and drain terminals of the illustrated MOS transistors with gate structures 44. Details of the doped portions of the active region 38 are not shown, but are rather well known to those skilled in the art.

Figure 5F:
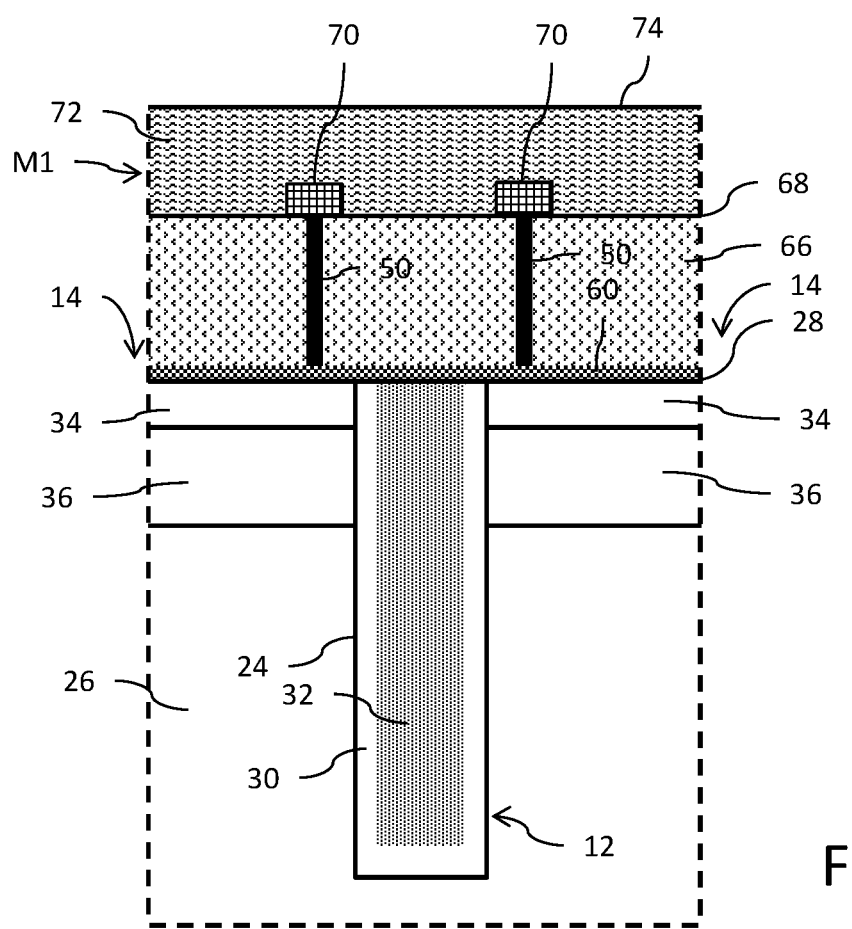

FIG. 5F shows a cross-section taken along line F-F of FIG. 4A through a portion of the photosensitive region 14 and a portion of an adjacent photosensitive region 14 of an adjacent pixel. The contact etch stop layer 60 is positioned above the top surface 28 of the substrate 26. The PMD layer 66 is positioned above the contact etch stop layer 60. The PMD layer 66 has a planarized top surface 68. The first metallization level M1 is positioned on top of the PMD layer 66. The first metallization level M1 includes metal lines 70 within the insulating layer 72. The insulating layer has a planarized top surface 74. A metal line is in physical contact with the metal shield trench 50 positioned between adjacent pixels.

Figure 6A:
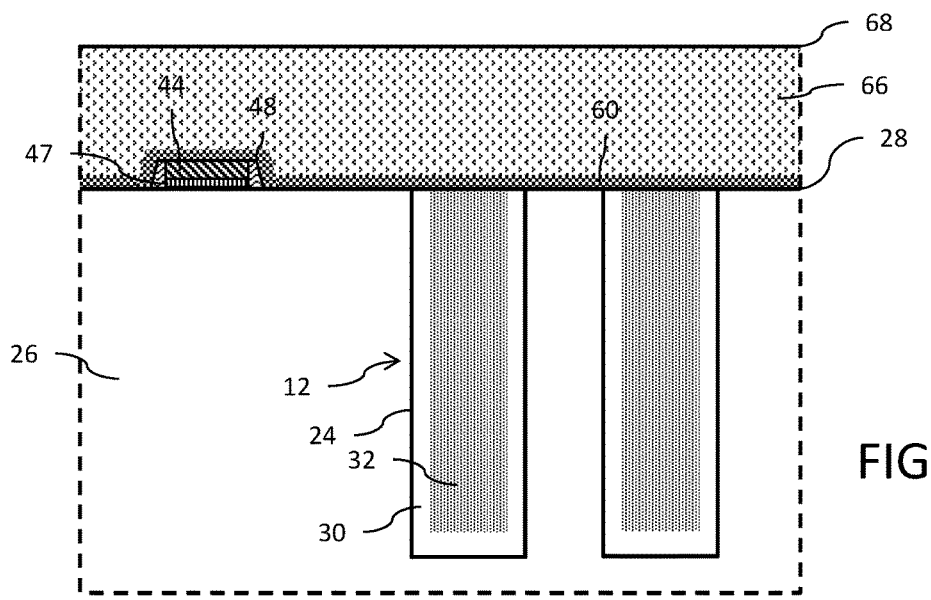
FIGS. 6A-6H show a middle end of line (MEOL) process for forming a metal contact and a metal shield trench in a premetallization dielectric layer of an integrated circuit.

Reference is now made to FIGS. 6A-6H showing a middle end of line (MEOL) process for forming the metal contact 46 and metal shield trench 50. The MEOL process starts after completion of front end of line (FEOL) processing. The FEOL process is, generally speaking, completed when the PMD layer 66 has been deposited and planarized. FIG. 6A shows the integrated circuit of the type shown in FIG. 4A at this point in time. The substrate 26 includes all needed doped regions as well as the CDTI structures 12 and STI structures 40. The structures above the top surface 28 of the substrate 26, such as MOS transistor gate-related components (gate dielectric 47, gate structure 44, sidewall spacers 48, etc.), the contact etch stop layer 60 and PMD layer 66, are also present.

Figure 6B:
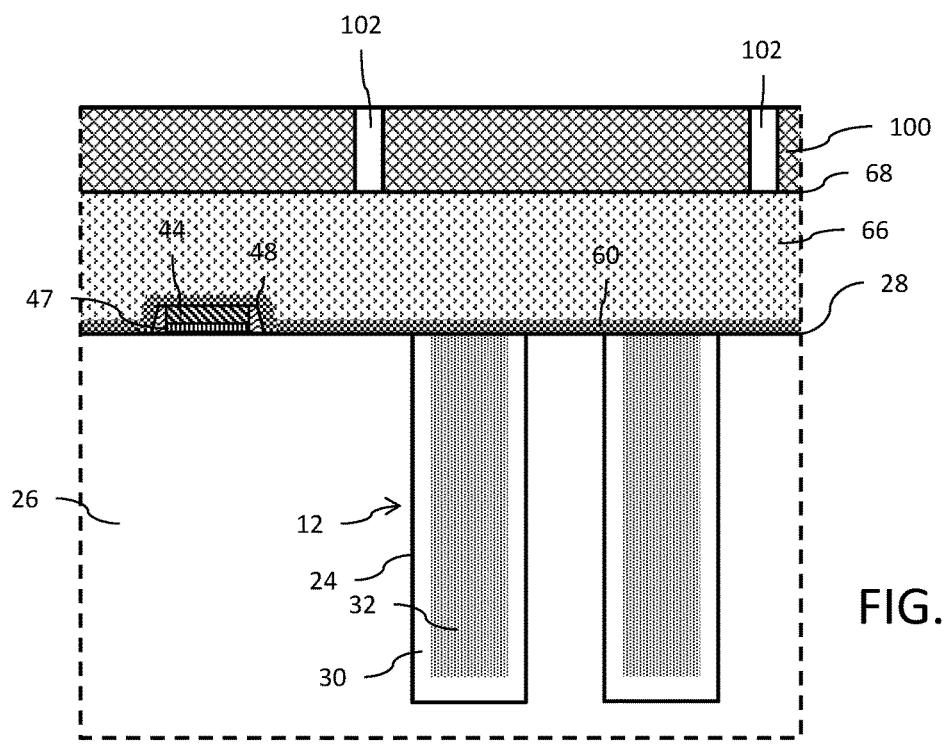

A multi-layer 100 comprising a bottom antireflective coating (BARC) and a resist is deposited on the top surface 68 of the PMD layer 66. The deposition may be made, for example, using a lithographic deposition by spin-on process. Conventional lithographic processing techniques known to those skilled in the art are then used to pattern the multi-layer 100 and form openings 102 at the locations where it is desired to provide metal shield trenches 50. The result is shown in FIG. 6B.

Figure 6C:
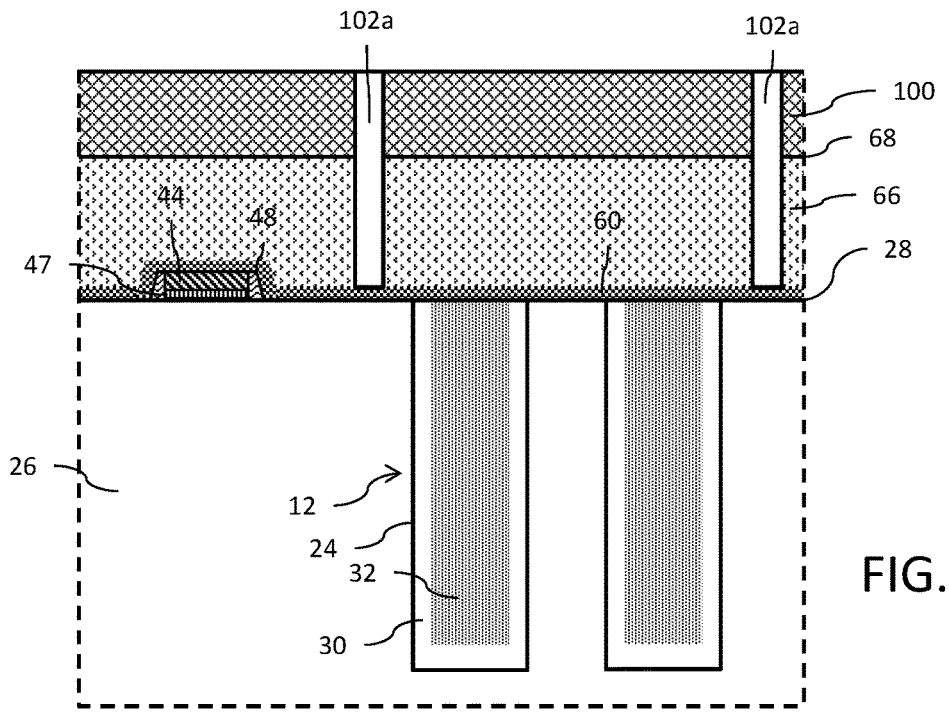

The lithographically patterned multi-layer 100 is then used as an etch mask. An etch is then performed to remove portions of the PMD layer 66 in alignment with the openings 102 and form openings 102a. The etch may, for example, comprise a reactive ion etch (RIE). The etch is controlled to stop at (or in), without passing through, the contact etch stop layer 60. The result is shown in FIG. 6C.

Figure 6D:
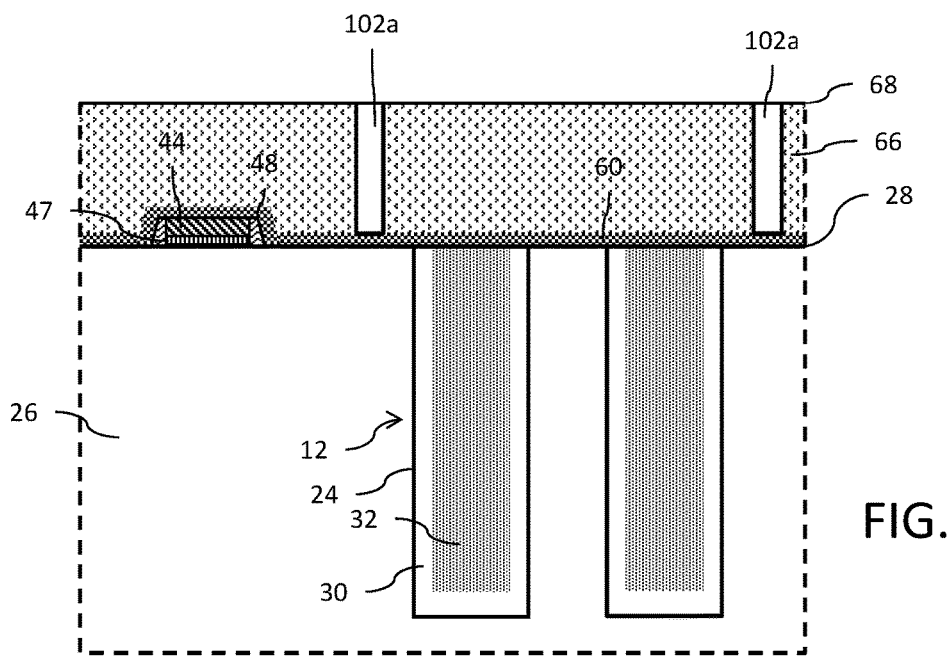

The multi-layer 100 is then removed using an in situ strip on reactive ion etching reactor. The result is shown in FIG. 6D.

Figure 6E:
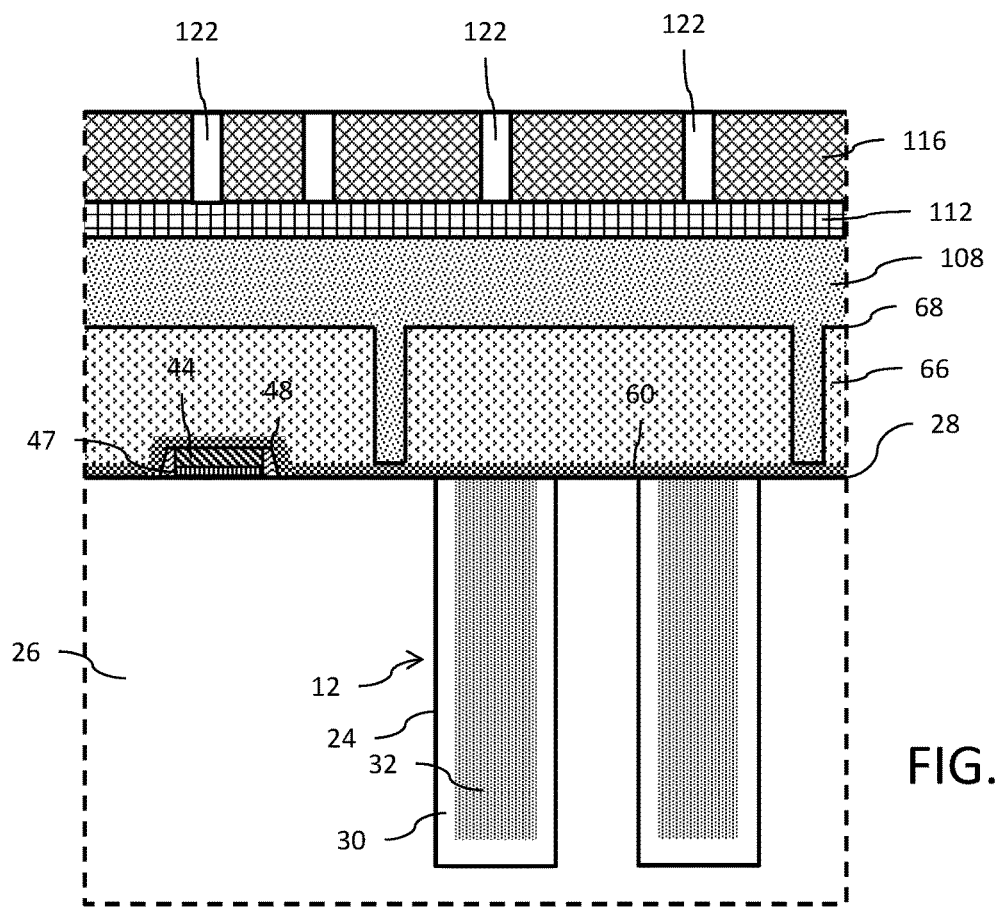

An organic planarization layer (OPL) 108 is then deposited using a lithographic deposition by spin-on process. The material fills the openings 102a in the PMD layer 66. A silicon-containing anti-reflective coating (SiARC) layer 112 is then deposited on the organic planarization layer 108 using a lithographic deposition by spin-on process. Finally, a resist layer 116 is deposited on the SiARC layer 112 using a lithographic deposition by spin-on process. Conventional lithographic processing techniques known to those skilled in the art are then used to pattern the resist layer 116 and form openings 122 at the locations where it is desired to provide metal contacts 46. The result is shown in FIG. 6E.

Figure 6F:
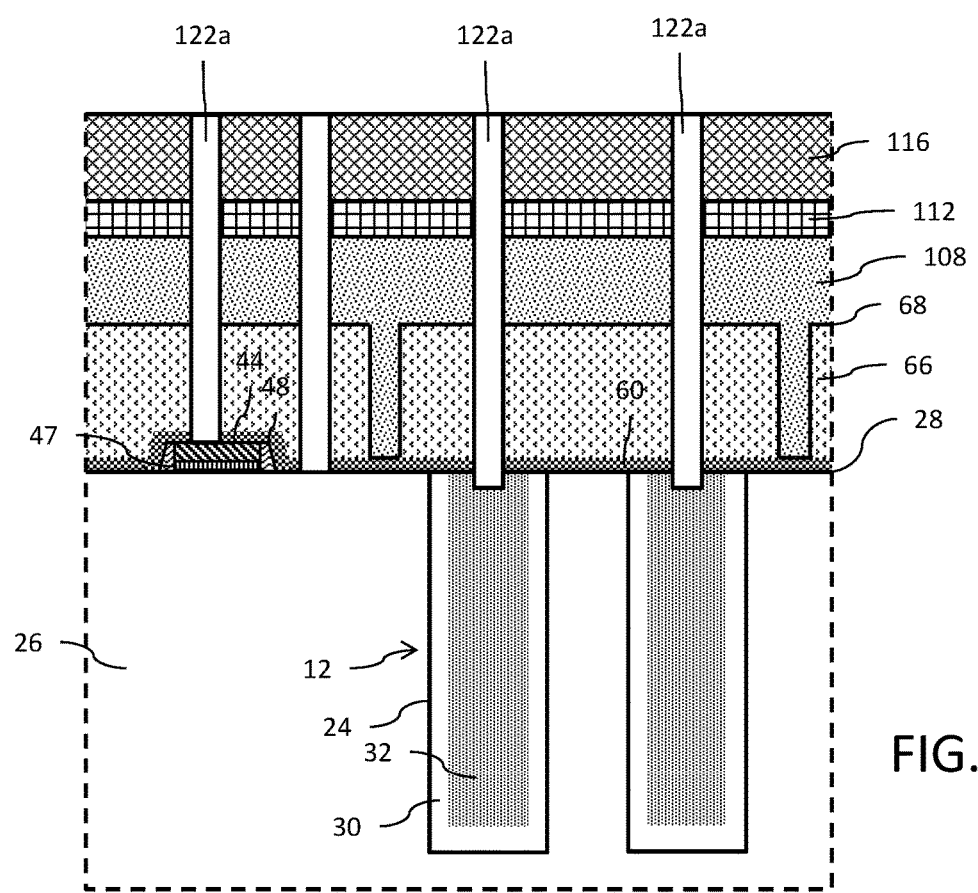

The lithographically patterned resist layer 116 is then used as an etch mask. An etch is then performed to remove portions of the SiARC layer 112, the organic planarization layer 108, the PMD layer 66 and the contact etch stop layer 66 in alignment with the openings 122 and form openings 122a. The etch may, for example, comprise a reactive ion etch (RIE). The etch is controlled to stop at (or in), without passing through, the gate structure 44 for the MOS transistor, the substrate 26 at the source/drain region for the MOS transistor and the conductive material 32 of the CDTI structure 12. The result is shown in FIG. 6F.

Figure 6G:
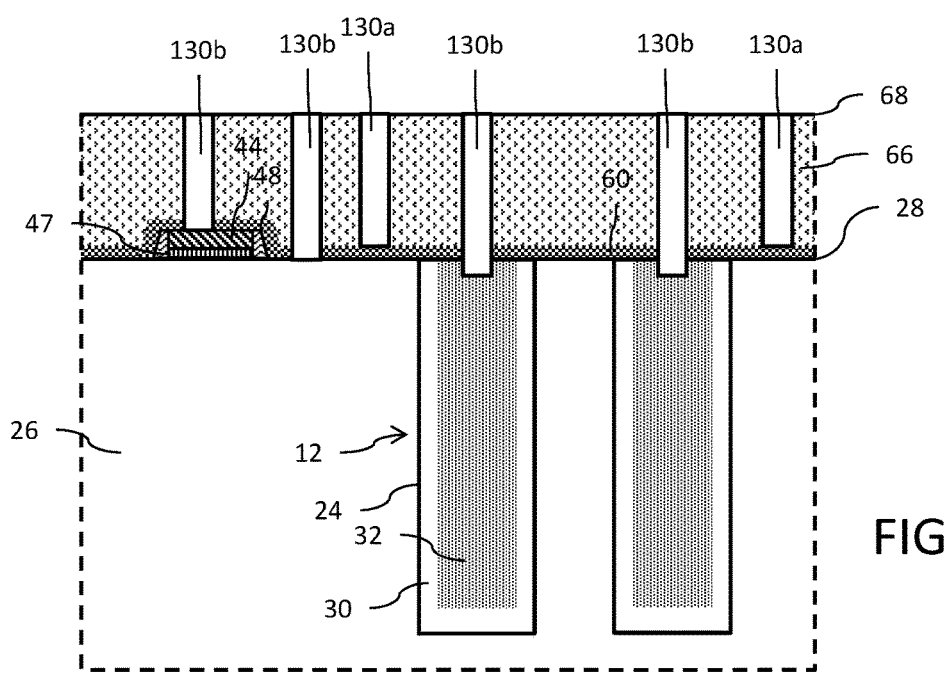

The lithographically patterned resist layer 116, the SiARC layer 112 and the organic planarization layer 108 are then removed leaving openings 130a at locations where it is desired to provide metal shield trenches 50 and locations 130b where it is desired to provide metal contacts 46. An in situ strip on reactive ion etching reactor may be used for this removal. The result is shown in FIG. 6G.

Figure 6H:
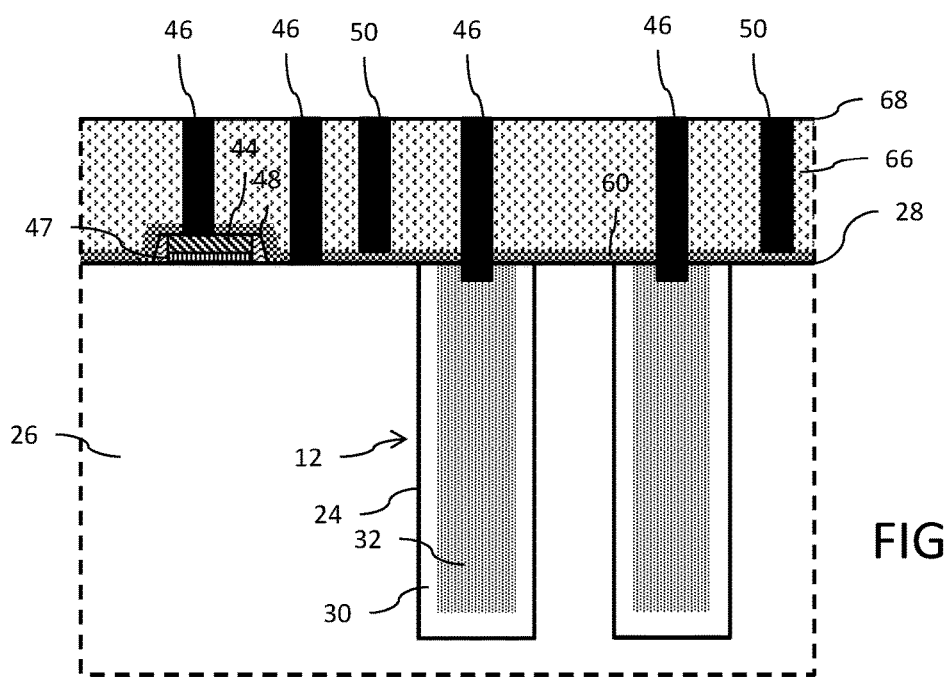

The openings 130a and 130b are then filled with a metal material, such as tungsten, to form the metal shield trenches 50 and metal contacts 46. A TiN liner may first be deposited followed by a tungsten deposition. The result is shown in FIG. 6H.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
   forming a conductive region supported by a semiconductor substrate;
   depositing a contact etch stop layer overlying the semiconductor substrate and covering the conductive region;
   depositing a premetallization dielectric layer overlying the contact etch stop layer;
   forming a first trench in the premetallization dielectric layer, said first trench extending through the premetallization dielectric layer and having a bottom terminating at or in, without passing through, the contact etch stop layer;
   filling said first trench with a non-conductive material;
   forming a second trench in the premetallization dielectric layer, said second trench extending through the premetallization dielectric layer and the contact etch stop layer and having a bottom terminating at or in, without passing through, the conductive region;
   removing the non-conductive material from the first trench; and
   filling the first and second trenches with a same metal material.

2. The method of claim 1, wherein the same metal material is tungsten.

3. The method of claim 1, wherein the non-conductive material is an organic planarization material.

4. The method of claim 1, wherein the conductive region is a source or drain region of a transistor formed within the semiconductor substrate.

5. The method of claim 1, wherein the conductive region is a conductive portion of a capacitive deep trench isolation structure formed within the semiconductor substrate.

6. The method of claim 1, wherein the conductive region is a gate region of a transistor supported by the semiconductor substrate.

7. The method of claim 1, wherein forming the first trench comprises:
   depositing a resist layer over the premetallization dielectric layer;
   lithographically patterning the resist layer to form an opening; and
   etching through said opening to form the first trench.

8. The method of claim 7, wherein said resist layer includes a bottom antireflection coating layer.

9. The method of claim 1, wherein forming the second trench comprises:
   depositing a planarization layer made of said non-conductive material over the premetallization dielectric layer and filling said first trench;
   depositing a further resist layer over the planarization layer;
   lithographically patterning the resist layer to form an opening; and
   etching through said opening to form the second trench.

10. The method of claim 9, wherein said further resist layer includes a silicon-containing anti-reflective coating layer.

11. A method, comprising:
    forming a doped source or drain region for a transistor in a semiconductor substrate;
    depositing a contact etch stop layer overlying the semiconductor substrate;
    depositing a premetallization dielectric layer overlying the contact etch stop layer;
    forming a first trench in the premetallization dielectric layer, said first trench extending through the premetallization dielectric layer and having a bottom terminating at or in, without passing through, the contact etch stop layer;
    filling said first trench with a non-conductive material;
    forming a second trench in the premetallization dielectric layer, said second trench extending through the premetallization dielectric layer and the contact etch stop layer and having a bottom terminating at or in, without passing through, the doped source or drain region;
    removing the non-conductive material from the first trench; and
    filling the first and second trenches with a same metal material.

12. The method of claim 11, wherein the same metal material is tungsten.

13. The method of claim 11, wherein the non-conductive material is an organic planarization material.

14. The method of claim 11, wherein forming the first trench comprises:
    depositing a resist layer over the premetallization dielectric layer;
    lithographically patterning the resist layer to form an opening; and
    etching through said opening to form the first trench.

15. The method of claim 11, wherein forming the second trench comprises:
    depositing a planarization layer made of said non-conductive material over the premetallization dielectric layer and filling said first trench;
    depositing a further resist layer over the planarization layer;
    lithographically patterning the resist layer to form an opening; and
    etching through said opening to form the second trench.

16. A method, comprising:
    forming a transistor having a gate over a semiconductor substrate;
    depositing a contact etch stop layer overlying the semiconductor substrate;
    depositing a premetallization dielectric layer overlying the contact etch stop layer;
    forming a first trench in the premetallization dielectric layer, said first trench extending through the premetallization dielectric layer and having a bottom terminating at or in, without passing through, the contact etch stop layer;
    filling said first trench with a non-conductive material;
    forming a second trench in the premetallization dielectric layer, said second trench extending through the premetallization dielectric layer and the contact etch stop layer and having a bottom terminating at or in, without passing through, the gate of transistor;
    removing the non-conductive material from the first trench; and
    filling the first and second trenches with a same metal material.

17. The method of claim 16, wherein the same metal material is tungsten.

18. The method of claim 16, wherein the non-conductive material is an organic planarization material.

19. The method of claim 16, wherein forming the first trench comprises:
depositing a resist layer over the premetallization dielectric layer;
lithographically patterning the resist layer to form an opening; and
etching through said opening to form the first trench.

20. The method of claim 16, wherein forming the second trench comprises:
depositing a planarization layer made of said non-conductive material over the premetallization dielectric layer and filling said first trench;
depositing a further resist layer over the planarization layer;
lithographically patterning the resist layer to form an opening; and
etching through said opening to form the second trench.

21. A method, comprising:
forming a capacitive deep trench isolation structure in a semiconductor substrate, the capacitive deep trench isolation structure including a conductive region;
depositing a contact etch stop layer overlying the semiconductor substrate;
depositing a premetallization dielectric layer overlying the contact etch stop layer;
forming a first trench in the premetallization dielectric layer, said first trench extending through the premetallization dielectric layer and having a bottom terminating at or in, without passing through, the contact etch stop layer;
filling said first trench with a non-conductive material;
forming a second trench in the premetallization dielectric layer, said second trench extending through the premetallization dielectric layer and the contact etch stop layer and having a bottom terminating at or in, without passing through, the conductive region of the capacitive deep trench isolation structure;
removing the non-conductive material from the first trench; and
filling the first and second trenches with a same metal material.

22. The method of claim 21, wherein the same metal material is tungsten.

23. The method of claim 21, wherein the non-conductive material is an organic planarization material.

24. The method of claim 21, wherein forming the first trench comprises:
depositing a resist layer over the premetallization dielectric layer;
lithographically patterning the resist layer to form an opening; and
etching through said opening to form the first trench.

25. The method of claim 21, wherein forming the second trench comprises:
depositing a planarization layer made of said non-conductive material over the premetallization dielectric layer and filling said first trench;
depositing a further resist layer over the planarization layer;
lithographically patterning the resist layer to form an opening; and
etching through said opening to form the second trench.

* * * * *